US010191331B2

(12) United States Patent
Park et al.

(10) Patent No.: US 10,191,331 B2
(45) Date of Patent: Jan. 29, 2019

(54) MASK AND METHOD OF FABRICATING DISPLAY DEVICE USING THE MASK

(71) Applicant: SAMSUNG DISPLAY CO., LTD., Yongin-si, Gyeonggi-do (KR)

(72) Inventors: Inho Park, Cheonan-si (KR); Sehwan Yu, Seoul (KR); Kyoungjun Kim, Seoul (KR); Jihyeon Son, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/018,651

(22) Filed: Jun. 26, 2018

(65) Prior Publication Data

US 2018/0307104 A1    Oct. 25, 2018

Related U.S. Application Data

(62) Division of application No. 15/095,301, filed on Apr. 11, 2016, now Pat. No. 10,042,210.

(30) Foreign Application Priority Data

Jun. 23, 2015    (KR) .................. 10-2015-0089105

(51) Int. Cl.
*G02F 1/1337*    (2006.01)
*G03F 1/36*    (2012.01)
(Continued)

(52) U.S. Cl.
CPC ...... *G02F 1/133788* (2013.01); *G02F 1/1368* (2013.01); *G02F 1/13439* (2013.01);
(Continued)

(58) Field of Classification Search
CPC ........ G02F 2001/133519; G02F 2001/134345; G02F 2001/133742; G02F 1/133788;
(Continued)

(56) References Cited

U.S. PATENT DOCUMENTS

2001/0049064 A1    12/2001 Lee et al.
2003/0218176 A1    11/2003 Zhao et al.
(Continued)

FOREIGN PATENT DOCUMENTS

| JP | 2010014921 A | 1/2010 |
| JP | 2010050348 A | 3/2010 |

(Continued)

OTHER PUBLICATIONS

Extended European Search Report for Application No. 16173031.0 dated Feb. 2, 2017.

*Primary Examiner* — Joseph L Williams
*Assistant Examiner* — Jose M Diaz
(74) *Attorney, Agent, or Firm* — Cantor Colburn LLP

(57) ABSTRACT

A mask includes a base substrate, and a light shielding pattern including a light transmitting portion and a light shielding portion on the base substrate, wherein the light shielding portion includes a third source electrode portion, a third drain electrode portion spaced apart from the third source electrode portion and including at least a portion parallel to the third source electrode portion, a first auxiliary light shielding portion at an end portion of the third source electrode portion facing the third drain electrode portion, and a second auxiliary light shielding portion at an end portion of the third drain electrode portion facing the third source electrode portion.

13 Claims, 16 Drawing Sheets

(51) Int. Cl.
*G02F 1/1362* (2006.01)
*G02F 1/1335* (2006.01)
*G02F 1/1343* (2006.01)
*G02F 1/1368* (2006.01)
*G03F 7/20* (2006.01)

(52) U.S. Cl.
CPC .. *G02F 1/133512* (2013.01); *G02F 1/133514* (2013.01); *G02F 1/134309* (2013.01); *G02F 1/136286* (2013.01); *G03F 1/36* (2013.01); *G02F 2001/133519* (2013.01); *G02F 2001/133742* (2013.01); *G02F 2001/134345* (2013.01); *G03F 7/70216* (2013.01)

(58) Field of Classification Search
CPC ......... G02F 1/134309; G02F 1/133514; G02F 1/1368; G02F 1/136286; G02F 1/133512; G02F 1/13439; G03F 1/36; G03F 7/70216

See application file for complete search history.

(56) References Cited

U.S. PATENT DOCUMENTS

| | | |
|---|---|---|
| 2005/0142457 A1 | 6/2005 | Lee |
| 2011/0156046 A1 | 6/2011 | Kim et al. |
| 2014/0291686 A1 | 10/2014 | Wang |
| 2015/0109266 A1 | 4/2015 | Hong et al. |
| 2015/0160518 A1 | 6/2015 | Wang et al. |

FOREIGN PATENT DOCUMENTS

| | | |
|---|---|---|
| KR | 1020080016012 A | 2/2008 |
| WO | 2013080516 A1 | 6/2013 |

MASK AND METHOD OF FABRICATING DISPLAY DEVICE USING THE MASK

This application is a divisional of U.S. patent application Ser. No. 15/095,301, filed on Apr. 11, 2016, which claims priority to Korean Patent Application No. 10-2015-0089105, filed on Jun. 23, 2015, and all the benefits accruing therefrom under 35 U.S.C. § 119, the content of which in its entirety is herein incorporated by reference.

BACKGROUND

1. Field

Exemplary embodiments of the invention relate to an exposure mask for forming a pattern and a method of fabricating a display device using the mask.

2. Description of the Related Art

Display devices are classified into types including a liquid crystal display ("LCD") device, an organic light emitting diode ("OLED") display device, a plasma display panel ("PDP") device, an electrophoretic display ("EPD") device, and the like, based on a light emitting scheme thereof.

Among these, an LCD device generally includes two substrates opposing one another and a liquid crystal layer interposed between the two substrates. One of the two substrates of the LCD device includes a plurality of thin film transistors ("TFT") and a pixel electrode disposed thereon, and the pixel electrode is driven by the TFT.

With growing demands for display devices having high resolution, a pixel may include three or more TFTs, and the TFT may have a significantly small size.

SUMMARY

In a case of fabricating such a small-sized thin film transistor ("TFT"), defects may occur in the TFT due to errors during the fabrication process thereof.

Exemplary embodiments of the invention are directed to a mask applicable to fabricating a display device including a small-sized TFT.

Exemplary embodiments of the invention are also directed to a method of fabricating a display device using the mask.

According to an exemplary embodiment of the invention, a mask includes a base substrate, and a light shielding pattern including a light transmitting portion and a light shielding portion on the base substrate, wherein the light shielding portion includes a first source electrode portion, a first drain electrode portion spaced apart from the first source electrode portion, a second source electrode portion connected to the first source electrode portion, a second drain electrode portion spaced apart from the second source electrode portion, a third source electrode portion connected to the second drain electrode portion, a third drain electrode portion spaced apart from the third source electrode portion and including at least a portion parallel to the third source electrode portion, a first auxiliary light shielding portion at an end portion of the third source electrode portion facing the third drain electrode portion, and a second auxiliary light shielding portion at an end portion of the third drain electrode portion facing the third source electrode portion.

In an exemplary embodiment, the first auxiliary light shielding portion may contact the third source electrode portion and may protrude toward the third drain electrode portion.

In an exemplary embodiment, the first auxiliary light shielding portion may be between the third source electrode portion and the third drain electrode portion while being spaced apart from the third source electrode portion.

In an exemplary embodiment, the first auxiliary light shielding portion may have a bar shape.

In an exemplary embodiment, the first auxiliary light shielding portion may have one of a circular shape and a polygonal shape.

In an exemplary embodiment, the second auxiliary light shielding portion may contact the third drain electrode portion and may protrude toward the third source electrode portion.

In an exemplary embodiment, the second auxiliary light shielding portion may be between the third source electrode portion and the third drain electrode portion while being spaced apart from the third drain electrode portion.

In an exemplary embodiment, the second auxiliary light shielding portion may have a bar shape.

In an exemplary embodiment, the second auxiliary light shielding portion may have one of a circular shape and a polygonal shape.

In an exemplary embodiment, the mask may further include a channel portion between the third source electrode portion and the third drain electrode portion.

In an exemplary embodiment, the channel portion may be a semi-transmissive portion.

In an exemplary embodiment, the third source electrode portion and the third drain electrode portion may be disposed in parallel to one another at both sides of the channel portion, respectively, and each of the third source electrode portion and the third drain electrode portion may have a bar shape.

In an exemplary embodiment, the third source electrode portion and the third drain electrode portion may be disposed in parallel to one another at both sides of the channel portion, respectively, and each of the third source electrode portion and the third drain electrode portion may have a bent bar shape.

In an exemplary embodiment, the auxiliary light shielding portion may be absent at an end portion of the first source electrode portion, an end portion of the first drain electrode portion, an end portion of the second source electrode portion, and an end portion of the second drain electrode portion.

According to another exemplary embodiment of the invention, a display device includes a first substrate, a first gate electrode, a second gate electrode and a third gate electrode on the first substrate, a gate insulating layer on the first gate electrode, the second gate electrode and the third gate electrode, a first semiconductor layer on the gate insulating layer, the first semiconductor layer including at least a portion overlapping the first gate electrode, a first source electrode including at least a portion overlapping the first semiconductor layer, a first drain electrode spaced apart from the first source electrode, the first drain electrode including at least a portion overlapping the first semiconductor layer, a second semiconductor layer on the gate insulating layer, the second semiconductor layer including at least a portion overlapping the second gate electrode, a second source electrode connected to the first source electrode, the second source electrode including at least a portion overlapping the second semiconductor layer, a second drain electrode spaced apart from the second source electrode, the second drain electrode including at least a portion overlapping the second semiconductor layer, a third semiconductor layer on the gate insulating layer, the third semiconductor layer including at least a portion overlapping the third gate electrode, a third source electrode connected to the second drain electrode, the third source electrode including at least a portion overlapping the third semiconductor layer, and a third drain electrode spaced apart from the third source electrode, the third drain electrode including at least a portion overlapping the third semiconductor layer, wherein a first protrusion protruding toward the third drain electrode is disposed at an end portion of the third source electrode, and a second protrusion protruding toward the third source electrode is disposed at an end portion of the third drain electrode.

In an exemplary embodiment, each of the third source electrode and the third drain electrode may have a width in a range of about 3 micrometers ($\mu$m) to about 5 $\mu$m, and each of the first protrusion and the second protrusion may have a protruding length in a range of about 0.1 $\mu$m to about 0.5 $\mu$m.

In an exemplary embodiment, the third source electrode and the third drain electrode may be disposed in parallel to one another on the third semiconductor layer, and each of the third source electrode and the third drain electrode may have a bar shape.

In an exemplary embodiment, the third source electrode and the third drain electrode may be disposed in parallel to one another on the third semiconductor layer, and each of the third source electrode and the third drain electrode may have a bent bar shape.

In an exemplary embodiment, the first and second protrusions may be absent at an end portion of the first source electrode, an end portion of the first drain electrode, an end portion of the second source electrode, and an end portion of the second drain electrode.

In an exemplary embodiment, the display device may further include a second substrate opposing the first substrate, and a liquid crystal layer between the first substrate and the second substrate.

According to still another exemplary embodiment of the invention, a method of fabricating a display device, the method includes forming a first gate electrode, a second gate electrode and a third gate electrode on a first substrate, forming a gate insulating layer on the first gate electrode, the second gate electrode and the third gate electrode, coating a semiconductor material on the gate insulating layer, coating a conductive material on the semiconductor material to form a conductive layer, coating a photoresist on the conductive layer, disposing a mask over the photoresist, irradiating light to the mask to perform selective light exposure on the photoresist, patterning the photoresist, and patterning the semiconductor material and the conductive layer using the patterned photoresist, and the mask includes a base substrate, and a light shielding pattern including a light transmitting portion and a light shielding portion on the base substrate, and the light shielding portion includes a first source electrode portion, a first drain electrode portion spaced apart from the first source electrode portion, a second source electrode portion connected to the first source electrode portion, a second drain electrode portion spaced apart from the second source electrode portion, a third source electrode portion connected to the second drain electrode portion, a third drain electrode portion spaced apart from the third source electrode portion, the third drain electrode portion including at least a portion parallel to the third source electrode portion, a first auxiliary light shielding portion at an end portion of the third source electrode portion, and a second auxiliary light shielding portion at an end portion of the third drain electrode portion.

In an exemplary embodiment, the first auxiliary light shielding portion may contact the third source electrode portion and may protrude toward the third drain electrode portion.

In an exemplary embodiment, the first auxiliary light shielding portion may be between the third source electrode portion and the third drain electrode portion while being spaced apart from the third source electrode portion.

In an exemplary embodiment, the first auxiliary light shielding portion may have a bar shape.

In an exemplary embodiment, the first auxiliary light shielding portion may have one of a circular shape and a polygonal shape.

In an exemplary embodiment, the second auxiliary light shielding portion may contact the third drain electrode portion and may protrude toward the third source electrode portion.

In an exemplary embodiment, the second auxiliary light shielding portion may be between the third source electrode portion and the third drain electrode portion while being spaced apart from the third drain electrode portion.

In an exemplary embodiment, the second auxiliary light shielding portion may have a bar shape.

In an exemplary embodiment, the second auxiliary light shielding portion may have one of a circular shape and a polygonal shape.

In an exemplary embodiment, the patterning of the semiconductor material and the conductive layer may include forming a third semiconductor layer including at least a portion overlapping the third gate electrode, a third source electrode including at least a portion overlapping the third semiconductor layer, and a third drain electrode spaced apart from the third source electrode and including at least a portion overlapping the third semiconductor layer, where the mask further includes a channel portion between the third source electrode portion and the third drain electrode portion, the channel portion for forming a channel of the third semiconductor layer.

In an exemplary embodiment, the channel portion may be a semi-transmissive portion.

In an exemplary embodiment, the third source electrode portion and the third drain electrode portion may be disposed in parallel to one another at both sides of the channel portion, respectively, and each of the third source electrode portion and the third drain electrode portion may have a bar shape.

In an exemplary embodiment, the third source electrode portion and the third drain electrode portion may be disposed in parallel to one another at both sides of the channel portion, respectively, and each of the third source electrode portion and the third drain electrode portion may have a bent bar shape.

The foregoing is illustrative only and is not intended to be in any way limiting. In addition to the illustrative exemplary embodiments, and features described above, further exemplary embodiments, and features will become apparent by reference to the drawings and the following detailed description.

BRIEF DESCRIPTION OF THE DRAWINGS

The above and other features and exemplary embodiments of the invention will be more clearly understood from the following detailed description taken in conjunction with the accompanying drawings, in which.

DETAILED DESCRIPTION

Figure 1:
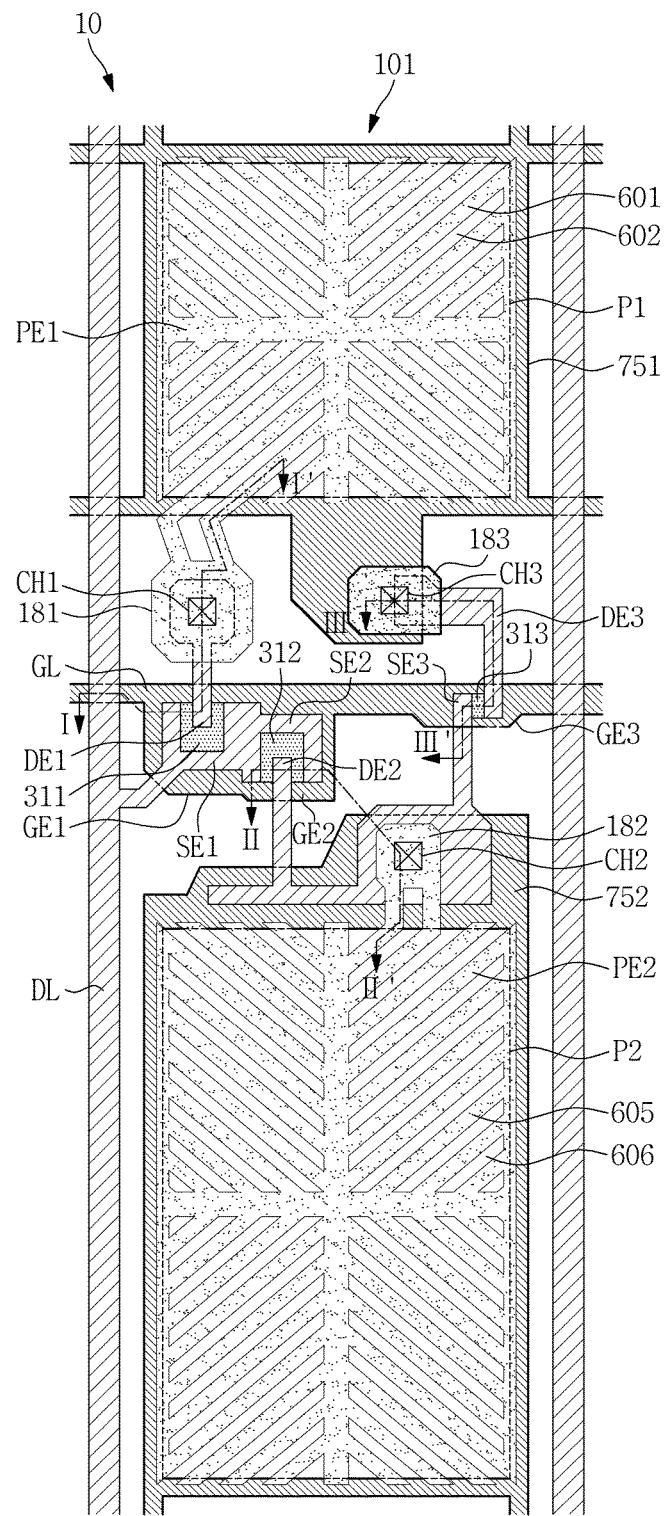
FIG. 1 is a plan view illustrating an exemplary embodiment of a display device.

Exemplary embodiments will now be described more fully hereinafter with reference to the accompanying drawings. However, they may be embodied in different forms and should not be construed as limited to the exemplary embodiments set forth herein. Rather, these exemplary embodiments are provided so that this disclosure will be thorough and complete, and will fully convey exemplary implementations to those skilled in the art.

In the drawings, certain elements or shapes may be simplified or exaggerated to better illustrate the invention, and other elements in an actual product may also be omitted. Thus, the drawings are intended to facilitate the understanding of the invention. Like reference numerals refer to like elements throughout the specification.

When a layer or element is referred to as being "on" another layer or element, the layer or element may be directly on the other layer or element, or one or more intervening layers or elements may be interposed therebetween.

Throughout the specification, when an element is referred to as being "connected" to another element, the element is "directly connected" to the other element, or "electrically connected" to the other element with one or more intervening elements interposed therebetween. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein. For example, element "A" can be termed as "first A", "second A" or "third A".

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). In an exemplary embodiment, "about" can mean within one or more standard deviations, or within ±30%, 20%, 10%, 5% of the stated value.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

When it is determined that a detailed description may make the purpose of the invention unnecessarily ambiguous in the description of the invention, such a detailed description will be omitted. In addition, the same components and corresponding components are given the same reference numeral.

Hereinafter, an exemplary embodiment of a display device will be described with reference to FIGS. 1, 2, 3 and 4.

Figure 2:
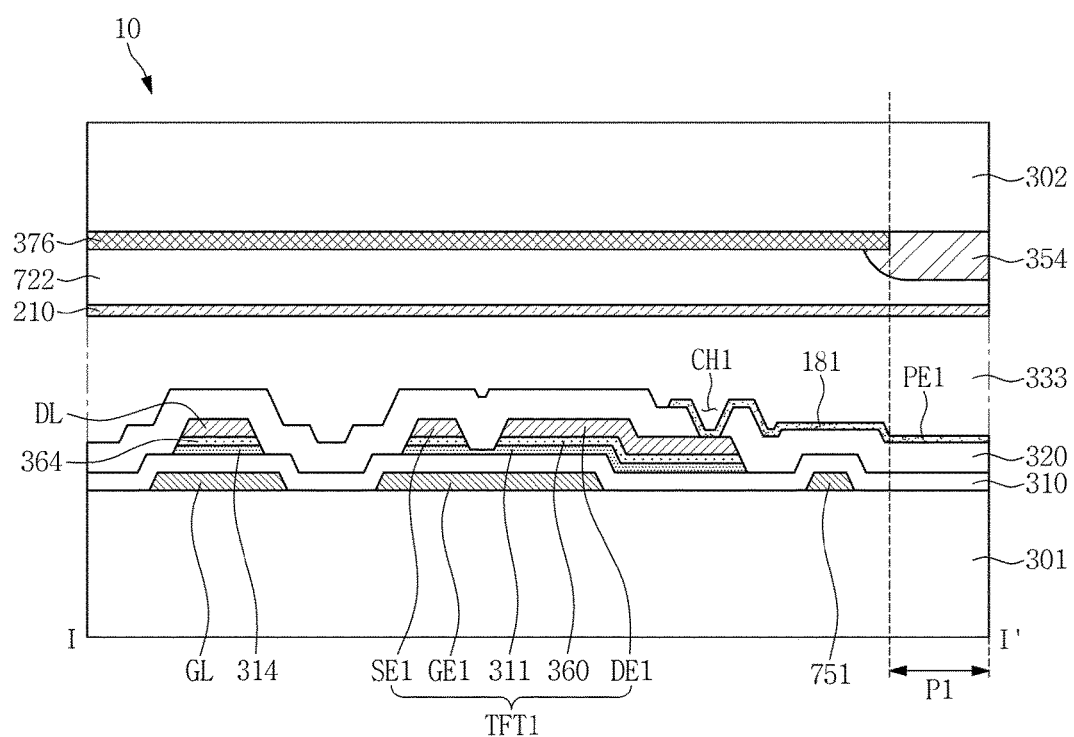
FIG. 2 is a cross-sectional view taken along section line I-I' of FIG. 1.
Figure 3:
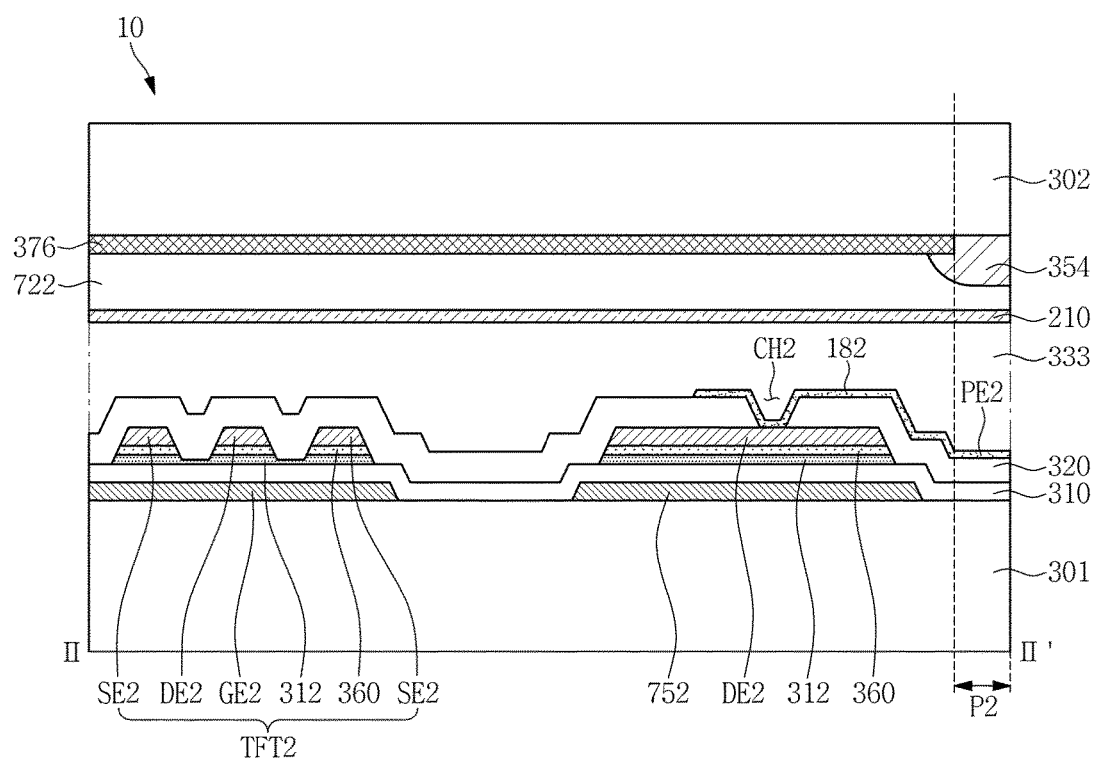
FIG. 3 is a cross-sectional view taken along section line II-II' of FIG. 1.
Figure 4:
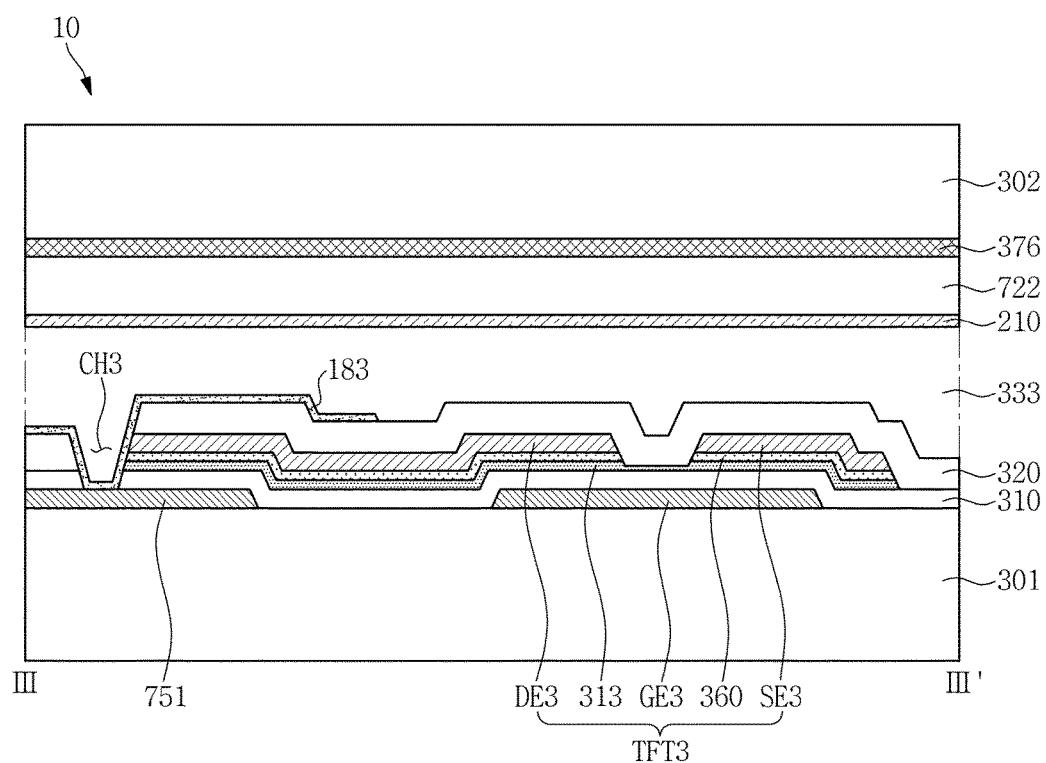
FIG. 4 is a cross-sectional view taken along section line III-III' of FIG. 1.

FIG. 1 is a plan view illustrating the display device according to the exemplary embodiment. FIG. 2 is a cross-sectional view taken along section line I-I' of FIG. 1. FIG. 3 is a cross-sectional view taken along section line II-II' of FIG. 1. FIG. 4 is a cross-sectional view taken along section line III-III' of FIG. 1.

The display device according to the exemplary embodiment is a liquid crystal display ("LCD") device 10. However, the display device is not limited thereto, and features of the invention may also be applied to an organic light emitting diode ("OLED") display device.

The LCD device 10 according to the exemplary embodiment includes a substrate 301, a second substrate 302 disposed to oppose the first substrate 301, and a liquid crystal layer 333 disposed between the first substrate 301 and the second substrate 302.

The LCD device 10 includes a plurality of pixels 101, and a single pixel 101 may include a first sub-pixel region P1 and a second sub-pixel region P2.

In detail, the pixel 101 of the LCD device 10, as illustrated in FIGS. 1 to 4, includes a gate line GL, a data line DL, a first thin film transistor TFT1, a second thin film transistor TFT2, a third thin film transistor TFT3, a first storage line 751, a second storage line 752, a first sub-pixel electrode PE1, a second sub-pixel electrode PE2, a first extension electrode 181, a second extension electrode 182, a third extension electrode 183, a common electrode 210, a color filter 354, and the liquid crystal layer 333.

The first thin film transistor TFT1, as illustrated in FIGS. 1 and 2, includes a first gate electrode GE1, a first semiconductor layer 311, a first source electrode SE1, and a first drain electrode DE1.

The second thin film transistor TFT2, as illustrated in FIGS. 1 and 3, includes a second gate electrode GE2, a second semiconductor layer 312, a second source electrode SE2, and a second drain electrode DE2.

The third thin film transistor TFT3, as illustrated in FIGS. 1 and 4, includes a third gate electrode GE3, a third semiconductor layer 313, a third source electrode SE3, and a third drain electrode DE3.

As illustrated in FIG. 2, the gate line GL is disposed on the first substrate 301. In detail, as illustrated in FIG. 1, the gate line GL is disposed between the first sub-pixel region P1 and the second sub-pixel region P2.

The gate lines GL, as illustrated in FIG. 1, may have different line widths. The first, second, and third gate electrodes GE1, GE2, and GE3 have a structure extending from the gate line GL. In other words, the gate line GL and the first, second and third gate electrodes GE1, GE2 and GE3 are unitary with one another.

Although not illustrated, the gate line GL may have a connection portion, for example, an end portion thereof, which is wider than another portion thereof in size, to be connected to another layer or an external driving circuit.

In an exemplary embodiment, the gate line GL may include at least one of an aluminum (Al) based metal such as Al or an Al alloy, a silver (Ag) based metal such as Ag or an Ag alloy, a copper (Cu) based metal such as Cu or an Cu alloy, and a molybdenum (Mo) based metal such as Mo or a Mo alloy. In an alternative exemplary embodiment, the gate line GL may include at least one of chromium (Cr), tantalum (Ta), and titanium (Ti). In an exemplary embodiment, the gate line GL may have a multilayer structure including at least two conductive layers having different physical properties from one another. In an exemplary embodiment, the gate line GL may have a double-layer structure including a Ti lower layer and a Cu upper layer, for example.

The first storage line 751 is disposed on the first substrate 301 to extend along at least one of sides of the first sub-pixel electrode PE1. In an exemplary embodiment, the first storage line 751, as illustrated in FIG. 1, may have a shape enclosing the first sub-pixel electrode PE1, for example. In the exemplary embodiment, the first storage line 751 and the first sub-pixel electrode PE1 may or may not overlap one another.

The first storage line 751 may receive an externally applied first storage voltage. In an exemplary embodiment, the first storage voltage may be a direct current ("DC") voltage.

The first storage line 751 may have the same structure as that of the gate line GL. In other words, the gate line GL and the first storage line 751 may be simultaneously provided in the same process.

The second storage line 752 may be disposed on the first substrate 301 to extend along at least one of sides of the second sub-pixel electrode PE2. In an exemplary embodiment, the second storage line 752, as illustrated in FIG. 1, may be disposed adjacent to at least one of the sides of the second sub-pixel electrode PE2, for example. In the exemplary embodiment, the second storage line 752 and the second sub-pixel electrode PE2 may or may not overlap one another.

The second storage line 752 and the first storage line 751 may be connected to one another.

The second storage line 752 may have the same structure as that of the gate line GL. In other words, the gate line GL and the second storage line 752 may be simultaneously provided in the same process.

A gate insulating layer 310 is disposed on the gate line GL, the first, second and third gate electrodes GE1, GE2 and GE3, the first storage line 751, and the second storage line 752. In the exemplary embodiment, the gate insulating layer 310 may be disposed over an entire surface of the first substrate 301 which includes the first storage line and the second storage line 752.

A third contact hole CH3 through which the first storage line 751 is exposed may be defined in the gate insulating layer 310, as illustrated in FIG. 4.

In an exemplary embodiment, the gate insulating layer 310 may include silicon nitride ($SiN_X$), silicon oxide ($SiO_X$), or the like. In an exemplary embodiment, the gate insulating layer 310 may have a multilayer structure including at least two insulating layers having different physical properties from one another.

The first, second, and third semiconductor layers 311, 312, and 313 are disposed on the gate insulating layer 310. In the exemplary embodiment, the first semiconductor layer 311 overlaps the first gate electrode GE1, the second semiconductor layer 312 overlaps the second gate electrode GE2, and the third semiconductor layer 313 overlaps the third gate electrode GE3.

The first, second, and third semiconductor layers 311, 312, and 313 may be connected to one another.

In an exemplary embodiment, the first, second, and third semiconductor layers 311, 312, and 313 may include amorphous silicon, polycrystalline silicon, or the like. In an alternative exemplary embodiment, the first, second, and third semiconductor layers 311, 312, and 313 may include an oxide semiconductor.

An ohmic contact layer 360 is disposed on the first, second, and third semiconductor layers 311, 312, and 313. In the exemplary embodiment, the ohmic contact layer 360 is not disposed on respective portions of the first, second, and third semiconductor layers 311, 312, and 313 corresponding to respective channel regions of the first, second, and third thin film transistors TFT1, TFT2, and TFT3.

In an exemplary embodiment, the ohmic contact layer 360 may include silicide or n+ hydrogenated amorphous silicon doped with n-type impurities, such as phosphorus, at high concentration.

The first source electrode SE1 and the first drain electrode DE1 included in the first thin film transistor TFT1, the second source electrode SE2 and the second drain electrode DE2 included in the second thin film transistor TFT2, and the third source electrode SE3 and the third drain electrode DE3 included in the third thin film transistor TFT3 are disposed on the ohmic contact layer 360.

The first source electrode SE1, as illustrated in FIG. 1, extends from the data line DL onto the first gate electrode GE1 to be disposed on the first gate electrode GE1 and the first semiconductor layer 311. The first source electrode SE1 overlaps the first gate electrode GE1 and the first semiconductor layer 311. In an exemplary embodiment, the first source electrode SE1 may have one of a C shape, an inverted-C shape, a U shape, and an inverted-U shape. By way of example, FIG. 1 illustrates the first source electrode SE1 having a U shape.

In an exemplary embodiment, the first source electrode SE1 may include a refractory metal such as chromium (Cr), tantalum (Ta) and titanium (Ti), or an alloy thereof. In an exemplary embodiment, the first source electrode SE1 may have a multilayer structure including a refractory metal layer and a low-resistance conductive layer. Examples of the multilayer structure may include a double-layer structure including a Cr or Mo (Mo alloy) lower layer and an Al (Al alloy) upper layer, a double-layer structure including a Ti lower layer and a Cu upper layer, and a triple-layer structure including a Mo (Mo alloy) lower layer, an Al (Al alloy) intermediate layer, and a Mo (Mo alloy) upper layer. Further, the first source electrode SE1 may include various other metals or conductive materials, in addition to, or instead of, the aforementioned materials.

The first drain electrode DE1 is disposed on the first gate electrode GE1 and the first semiconductor layer 311 while being spaced apart from the first source electrode SE1. The first drain electrode DE1 overlaps the first gate electrode GE1, the first semiconductor layer 311, and the first extension electrode 181. In the exemplary embodiment, the first drain electrode DE1 is connected to the first extension electrode 181 through the first contact hole CH1.

The first drain electrode DE1 may have the same structure as that of the first source electrode SE1. In other words, the first drain electrode DE1 and the first source electrode SE1 may be simultaneously provided in the same process.

The first gate electrode GE1, the first source electrode SE1, the first drain electrode DE1, the first semiconductor layer 311, and the ohmic contact layer 360 constitute the first thin film transistor TFT1. In the exemplary embodiment, a channel of the first thin film transistor TFT1 is defined in a portion of the first semiconductor layer 311 between the first source electrode SE1 and the first drain electrode DE1. The portion of the first semiconductor layer 311 corresponding to the channel may have a thickness less than that of another portion of the first semiconductor layer 311.

The second source electrode SE2 is electrically connected to the first source electrode SE1. To this end, the second source electrode SE2 and the first source electrode SE1 may be unitary. The second source electrode SE2 may be disposed on the second gate electrode GE2 and the second semiconductor layer 312. The second source electrode SE2 overlaps the second gate electrode GE2 and the second semiconductor layer 312. In an exemplary embodiment, the second source electrode SE2 may have one of a C shape, an inverted-C shape, a U shape, and an inverted-U shape. By way of example, FIG. 1 illustrates the second source electrode SE2 having an inverted-U shape. In other words, the second source electrode SE2 may have an inverted shape with respect to the shape of the first source electrode SE1.

The second source electrode SE2 may have the same structure as that of the first source electrode SE1. In other words, the second source electrode SE2 and the first source electrode SE1 may be simultaneously provided in the same process.

The second drain electrode DE2 is disposed on the second gate electrode GE2 and the second semiconductor layer 312 while being spaced apart from the second source electrode SE2. The second drain electrode DE2 overlaps the second gate electrode GE2, the second semiconductor layer 312, and the second extension electrode 182. In the exemplary embodiment, the second drain electrode DE2 is connected to the second extension electrode 182 through the second contact hole CH2.

The second drain electrode DE2 may include the same material and may have the same structure (multilayer structure) as those of the first source electrode SE1. In other words, the second drain electrode DE2 and the first source electrode SE1 may be simultaneously provided in the same process.

The second gate electrode GE2, the second source electrode SE2, the second drain electrode DE2, the second semiconductor layer 312, and the ohmic contact layer 360 constitute the second thin film transistor TFT2. In the exemplary embodiment, a channel of the second thin film transistor TFT2 may be defined in a portion of the second semiconductor layer 312 between the second source electrode SE2 and the second drain electrode DE2. The portion of the second semiconductor layer 312 corresponding to the channel may have a thickness less than that of another portion of the second semiconductor layer 312.

The third source electrode SE3 is electrically connected to the second drain electrode DE2. To this end, the third source electrode SE3 and the second drain electrode DE2 may be unitary. The third source electrode SE3 is disposed on the third gate electrode GE3 and the third semiconductor layer 313. The third source electrode SE3 overlaps the third gate electrode GE3 and the third semiconductor layer 313.

The third source electrode SE3 may have the same structure as that of the first source electrode SE1. In other words, the third source electrode SE3 and the first source electrode SE1 may be simultaneously provided in the same process.

The third drain electrode DE3 is disposed on the third gate electrode GE3, the third semiconductor layer 313 and the first storage line 751 while being spaced apart from the third source electrode SE3. The third drain electrode DE3 overlaps the third gate electrode GE3, the third semiconductor layer 313, the first storage line 751, and the third extension electrode 183. In an exemplary embodiment, the third drain electrode DE3 is connected to the third extension electrode 183 through the third contact hole CH3.

The third drain electrode DE3 may have the same structure as that of the first source electrode SE1. In other words, the third drain electrode DE3 and the first source electrode SE1 may be simultaneously provided in the same process.

The third gate electrode GE3, the third source electrode SE3, the third drain electrode DE3, the third semiconductor layer 313, and the ohmic contact layer 360 constitute the third thin film transistor TFT3. In an exemplary embodiment, a channel of the third thin film transistor TFT3 may be defined in a portion of the third semiconductor layer 313 between the third source electrode SE3 and the third drain electrode DE3. The portion of the third semiconductor layer 313 corresponding to the channel may have a thickness less than that of another portion of the third semiconductor layer 313.

The data line DL is disposed on the gate insulating layer 310. Although not illustrated, the data line DL may have a connection portion, for example, an end portion thereof, which is wider than another portion thereof in size, to be connected to another layer or an external driving circuit.

The data line DL intersects the gate line GL and the first storage line 751. Although not illustrated, in an exemplary embodiment, the data line DL may have a narrower line width at a position at which the data line DL and the gate line GL intersect one another than a line width of another portion of the data line DL. Similarly, the data line DL may have a narrower line width at a position at which the data line DL and the first or second storage line 751 or 752 intersect one another than a line width of another portion of the data line DL. Accordingly, parasitic capacitance between the data line DL and the gate line GL, and capacitance between the data line DL and the first or second storage line 751 or 752 may decrease. The data line DL may have the same structure as that of the first source electrode SE1. In other words, the data line DL and the first source electrode SE1 may be simultaneously provided in the same process.

A semiconductor layer 314 and an ohmic contact layer 364 are disposed below the data line DL. In an exemplary embodiment, as illustrated in FIG. 2, the semiconductor layer 314 and the ohmic contact layer 364 are disposed between the data line DL and the gate insulating layer 310, for example.

Hereinafter, the data line DL, the first source electrode SE1, the second source electrode SE2, the third source electrode SE3, the first drain electrode DE1, the second drain electrode DE2, and the third drain electrode DE3 are collectively referred to as a "data wiring unit". The data wiring unit may be provided by light exposure and etching processes using a mask.

A passivation layer 320 is disposed on the data wiring unit. In detail, the passivation layer 320 is disposed over an entire surface of the first substrate 301 on which the data line DL, the first, second, and third source electrodes SE1, SE2, and SE3, and the first, second, and third drain electrodes DE1, DE2, and DE3 are disposed. The passivation layer 320 may serve to protect the data wiring unit.

In an exemplary embodiment, the passivation layer 320 may include an inorganic insulating material such as $SiN_X$ or $SiO_X$, or an organic insulating material. In an exemplary embodiment, the passivation layer 320 may have a double-layer structure including a lower inorganic layer and an upper organic layer. In an exemplary embodiment, the passivation layer 320 may have a thickness greater than or equal to about 5000 angstroms (Å), and more particularly, in a range of about 6000 Å to about 8000 Å, for example.

Portions of the passivation layer 320 are removed to define first, second, and third contact holes CH1, CH2, and CH3 therein through which the first, second, and third drain electrodes DE1, DE2, and DE3 are exposed, respectively.

The first sub-pixel electrode PE1 is disposed on the passivation layer 320. In detail, the first sub-pixel electrode PE1 is disposed on the passivation layer 320 in the first sub-pixel region P1.

The first sub-pixel electrode PE1 includes a plurality of branch electrodes 601 provided by a cut-out portion 602. Referring to FIG. 1, the first sub-pixel electrode PE1 has a structure in which the plurality of branch electrodes 601 is connected to one another. In an exemplary embodiment, the first sub-pixel electrode PE1 may include a transparent conductive oxide ("TCO") such as indium-tin oxide ("ITO"), indium-zinc oxide ("IZO") or aluminum-zinc oxide ("AZO").

The second sub-pixel electrode PE2 is disposed on the passivation layer 320. In detail, the second sub-pixel electrode PE2 is disposed on the passivation layer 320 in the second sub-pixel region P2.

The second sub-pixel electrode PE2 has substantially the same structure as that of the first sub-pixel electrode PE1. In other words, the second sub-pixel electrode PE2 includes a plurality of branch electrodes 605 provided by a cut-out portion 606. Referring to FIG. 1, the second sub-pixel electrode PE2 has a structure in which the plurality of branch electrodes 605 is connected to one another.

The third extension electrode 183 is disposed on the passivation layer 320. The third extension electrode 183 overlaps the first storage line 751 and the third drain electrode DE3. The third extension electrode 183 is connected to the first storage line 751 and the third drain electrode DE3 through the third contact hole CH3.

The third extension electrode 183 may include the same material as that included in the first sub-pixel electrode PE1.

Although not illustrated, the LCD device 10 may further include a protection line. The protection line is disposed on the passivation layer 320. In detail, the protection line may be disposed to overlap the data line DL, and may have a line width wider than that of the data line DL.

In addition, the protection line may include the same material as that included in the first sub-pixel electrode PE1. In an exemplary embodiment, the protection line may be connected to the third extension electrode 183. In other words, the protection line and the third extension electrode 183 may be unitary.

A common voltage may be applied to the protection line. According to an alternative exemplary embodiment, a voltage having a level lower than or equal to that of the common voltage may be applied to the protection line.

Although not illustrated, a lower alignment layer may be disposed on the first sub-pixel electrode PE1, the first extension electrode 181, the second sub-pixel electrode PE2, the second extension electrode 182, the third extension electrode 183, and the passivation layer 320. The lower alignment layer may be a homeotropic alignment layer or may include a photo-reactive material.

A black matrix 376 is disposed on the second substrate 302. In detail, the black matrix 376 is disposed on a portion of the second substrate 302 aside from a portion thereof corresponding to the pixel region including the first sub-pixel region P1 and the second sub-pixel region P2. In an alternative exemplary embodiment, the black matrix 376 may be disposed on the first substrate 301.

The color filter 354 is disposed in the pixel region. In an exemplary embodiment, the color filter 354 includes a red color filter, a green color filter, and a blue color filter, for example. In an alternative exemplary embodiment, the color filter 354 may be disposed on the first substrate 301.

An overcoat layer 722 is disposed on the black matrix 376 and the color filter 354. In an exemplary embodiment, the overcoat layer 722 may be disposed over an entire surface of the second substrate 302 on which the black matrix 376 and the color filter 354 are disposed.

The overcoat layer 722 serves to remove a step difference between the black matrix 376 and the color filter 354, and protects the color filter 354.

A common electrode 210 is disposed on the overcoat layer 722. In an exemplary embodiment, the common electrode 210 may be disposed over an entire surface of the second substrate 302 on which the overcoat layer 722 is disposed. In an alternative exemplary embodiment, the common electrode 210 may be disposed on portions of the overcoat layer 722 corresponding to the first sub-pixel region P1 and the second sub-pixel region P2.

A common voltage may be applied to the common electrode 210. The common electrode 210 may include the same material as that included in the first sub-pixel electrode PE1.

Although not illustrated, an upper alignment layer may be disposed on the common electrode 210 and the overcoat layer 722. The upper alignment layer may be a homeotropic alignment layer, and may be an alignment layer which is photo-aligned using a photo-polymerization material.

When surfaces of the first substrate 301 and the second substrate 302 that face one another are defined as upper surfaces, e.g., inner surfaces, of the corresponding substrates, respectively, and surfaces of the first substrate 301 and the second substrate 302 opposite to the upper surfaces thereof are defined as lower surfaces, e.g., outer surfaces, of the corresponding substrates, respectively, an upper polarizer may further be disposed on the lower surface of the first substrate 301, and a lower polarizer may further be disposed on the lower surface of the second substrate 302.

Figure 5:
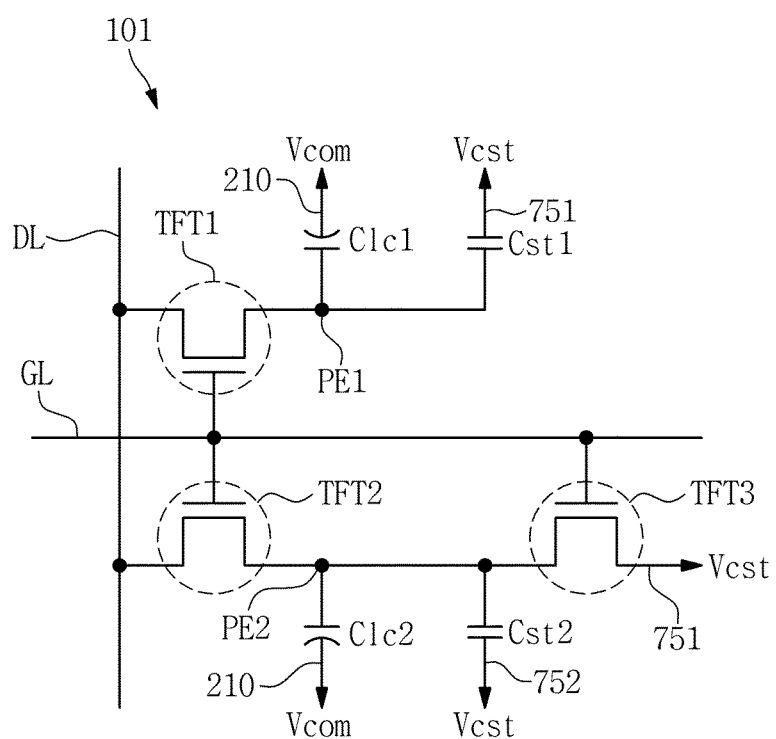
FIG. 5 is an equivalent circuit diagram of a pixel illustrated in FIG. 1.

FIG. 5 is an equivalent circuit diagram of the pixel 101 illustrated in FIG. 1.

The pixel 101, as illustrated in FIG. 5, includes the first thin film transistor TFT1, a first liquid crystal capacitor Clc1, a first storage capacitor Cst1, the second thin film transistor TFT2, a second liquid crystal capacitor Clc2, a second storage capacitor Cst2, and the third thin film transistor TFT3.

The first thin film transistor TFT1 is controlled based on a gate signal from the gate line GL, and is connected between the data line DL and the first sub-pixel electrode PE1. The first thin film transistor TFT1 is turned on by the gate signal to thereby apply a data signal from the data line DL to the first sub-pixel electrode PE1.

The first liquid crystal capacitor Clc1 is connected between the first sub-pixel electrode PE1 and the common electrode 210 opposing one another. In addition, a common voltage Vcom is applied to the common electrode 210.

The first storage capacitor Cst1 is connected between the first sub-pixel electrode PE1 and the first storage line 751 opposing one another. A storage voltage Vsct is applied to the first storage line 751. In an exemplary embodiment, the storage voltage Vsct may have the same level as that of the common voltage Vcom.

The second thin film transistor TFT2 is controlled based on a gate signal from the gate line GL, and is connected between the data line DL and the second sub-pixel electrode PE2. The second thin film transistor TFT2 is turned on by the gate signal to thereby apply a data signal from the data line DL to the second sub-pixel electrode PE2.

The second liquid crystal capacitor Clc2 is connected between the second sub-pixel electrode PE2 and the common electrode 210 opposing one another.

The second storage capacitor Cst2 is connected between the second sub-pixel electrode PE2 and the second storage line 752 opposing one another. A storage voltage Vsct is applied to the second storage line 752. In an exemplary embodiment, the storage voltage Vsct may have the same level as that of the common voltage Vcom.

The third thin film transistor TFT3 is controlled based on a gate signal from the gate line GL, and is connected between the second sub-pixel electrode PE2 and the first storage line 751. The third thin film transistor TFT3 is turned on by the gate signal to thereby apply a data signal from the second sub-pixel electrode PE2 to the first storage line 751.

Hereinafter, the operation of the pixel 101 illustrated in FIG. 5 will be described.

When a gate signal is applied to the gate line GL, data voltages transmitted to the data line DL are applied to the first sub-pixel electrode PE1 and the second sub-pixel electrode PE2 through the first thin film transistor TFT1 and the second thin film transistor TFT2, respectively.

The data voltage transmitted through the first thin film transistor TFT1 is totally applied to the first sub-pixel electrode PE1 whereas only a portion of the data voltage transmitted through the second thin film transistor TFT2 is applied to the third thin film transistor TFT3 and to the second sub-pixel electrode PE2. Accordingly, a luminance of the first sub-pixel region P1 in which the first sub-pixel electrode PE1 is disposed is higher than a luminance of the second sub-pixel region P2 in which the second sub-pixel electrode PE2 is disposed.

In detail, when a gate signal is applied to the gate line GL, a data voltage applied to the second source electrode SE2 of the second thin film transistor TFT2 passes through a channel to be transmitted to the second drain electrode DE2 of the second thin film transistor TFT2. A portion of the data voltage transmitted to the second drain electrode DE2 of the second thin film transistor TFT2 is applied to the second sub-pixel electrode PE2, and another portion of the data voltage is discharged to the first storage line 751 through the third thin film transistor TFT3. In an exemplary embodiment, the data voltage is divided by a resistance ratio between the second thin film transistor TFT2 and the third thin film transistor TFT3.

The high-resolution LCD device 10 includes a small-sized thin film transistor to enhance an aperture ratio of the pixel 101. In particular, the third thin film transistor TFT3, which is a resistive diode ("RD"), has a small size and a short channel. Accordingly, defects may occur in the third thin film transistor TFT3 due to process errors that may occur during the fabricating process thereof.

Figure 6A:
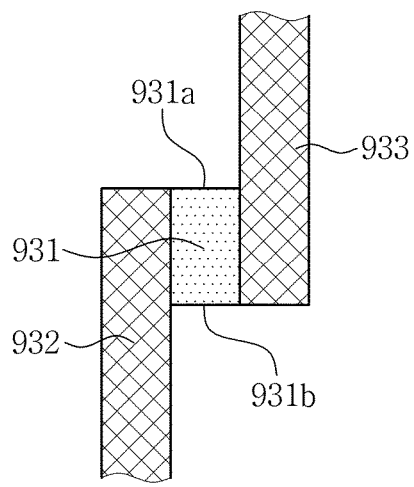
FIGS. 6(A) and 6(B) are plan views illustrating a portion of a conventional mask and a thin film transistor ("TFT") fabricated using the mask, respectively.
Figure 6B:
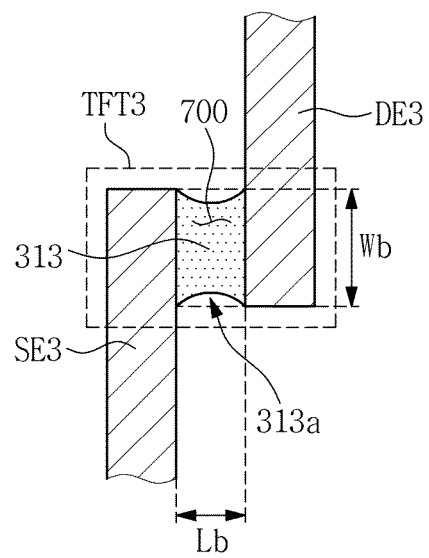

FIGS. 6(a) and 6(b) are plan views illustrating a portion of a conventional mask and a thin film transistor fabricated using the mask, respectively.

A channel 700 of the third thin film transistor TFT3 is defined by the third source electrode SE3 and the third drain electrode DE3, and has a relatively short length Lb. Accordingly, the channel 700 of the third thin film transistor TFT3 has an overall linear shape. In a process of fabricating the third thin film transistor TFT3 by light exposure and etching using a photoresist ("PR") and an exposure mask, a photoresist pattern having a linear shape is provided on the channel 700 so as to form the channel 700 having a linear shape. However, due to a difference in an exposure amount caused by light interference or stitch exposure, it may be difficult for the photoresist having a linear shape on the channel 700 to maintain a uniform thickness and width. Accordingly, defects may occur during a process of forming the channel 700.

In detail, FIG. 6(a) is a plan view illustrating a portion of a mask including a third source electrode portion 932 for forming the third source electrode SE3, a third drain electrode portion 933 for forming the third drain electrode DE3, and a third channel portion 931 corresponding to the channel 700 of the third semiconductor layer 313.

Referring to FIGS. 6(a) and 6(b), the third channel portion 931 corresponding to a region of the channel 700 of the third semiconductor layer 313 is a semi-transmissive portion, and is disposed to have a thin linear shape between the third source electrode portion 932 and the third drain electrode portion 933.

An area other than the third source electrode portion 932, the third drain electrode portion 933, and the third channel portion 931 is a light transmitting portion 905 (refer to FIG. 8), and the light transmitting portion 905 has a wide planar area. A sufficient amount of light for exposure is irradiated to the light transmitting portion 905, and the light irradiated to the light transmitting portion 905 affects photoresists disposed on boundary portions 931a and 931b between the third channel portion 931 and the light transmitting portion 905. Accordingly, the photoresists disposed on the boundary portions 931a and 931b of the third channel portion 931 are over-exposed or shifted, whereby an edge of the semiconductor layer 313 is over-etched more than necessary. Due to the over-etching of the semiconductor layer 313, an edge of the channel 700 is damaged to thereby form a concave portion 313a as illustrated in FIG. 6(b).

A width Wb of the channel 700 varies based on a portion thereof due to the concave portion 313a, and accordingly, a change or errors in a signal transmission through the channel 700 may occur. Such a change or errors in a signal transmission may cause defective display quality.

To prevent the generation of the concave portion 313a in the region of the channel 700, an exemplary embodiment provides a mask 20 including a first auxiliary light shielding portion at an end portion of the third source electrode portion 932 and a second auxiliary light shielding portion at an end portion of the third drain electrode portion 933.

Hereinafter, the mask 20 according to the exemplary embodiment will be described with reference to FIGS. 7, 8, and 9.

Figure 7:
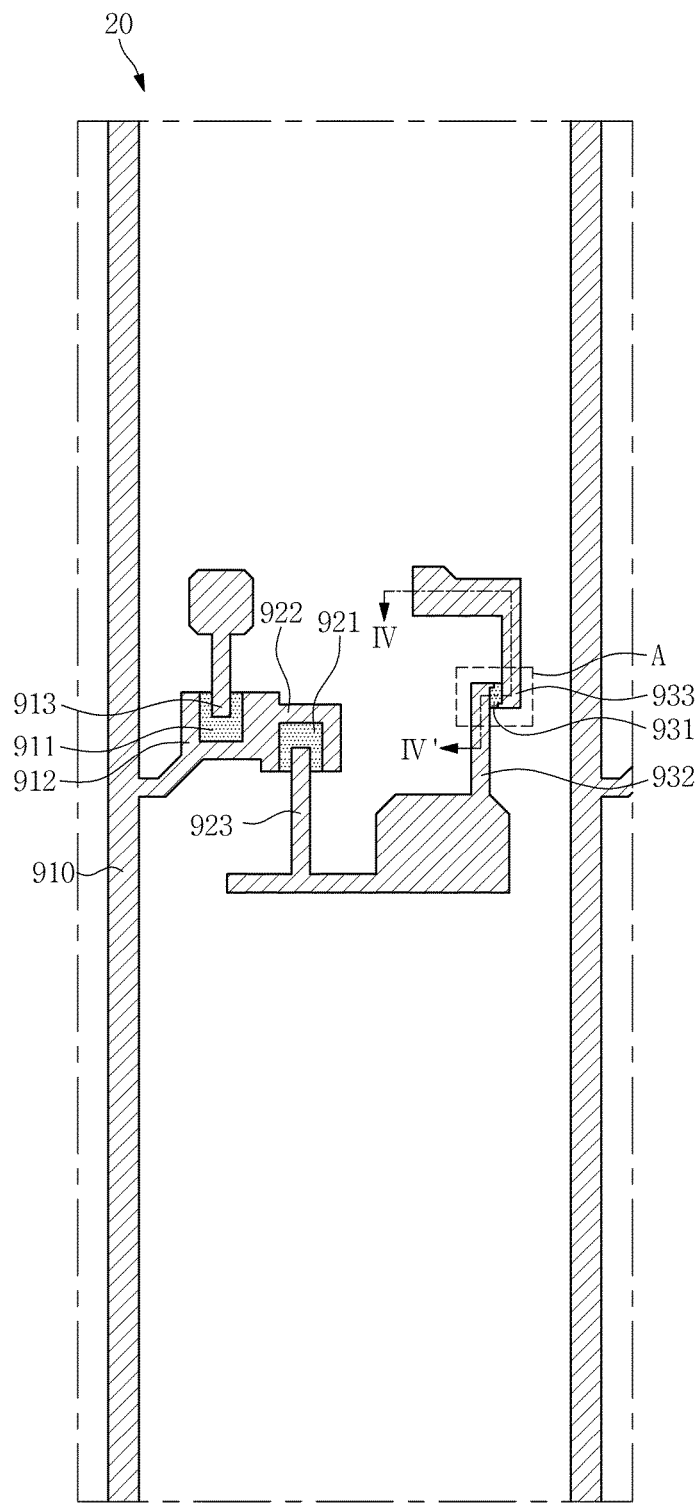
FIG. 7 is a plan view illustrating an exemplary embodiment of a mask.
Figure 8:
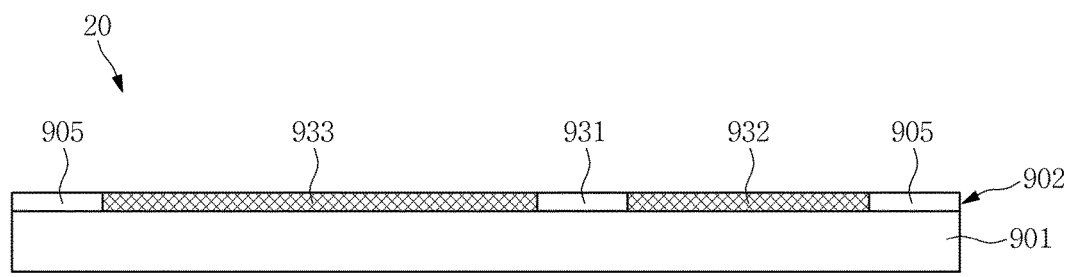
FIG. 8 is a cross-sectional view taken along section line IV-IV' of FIG. 7.

FIG. 7 is a plan view illustrating the mask 200 according to the exemplary embodiment. FIG. 8 is a cross-sectional view taken along section line IV-IV' of FIG. 7. FIG. 9 is an enlarged view illustrating portion "A" of FIG. 7.

The mask 20 according to the exemplary embodiment is a mask for forming the data wiring unit including the data line DL, the first, second and third source electrodes SE1, SE2 and SE3, the first, second and third drain electrodes, DE1, DE2 and DE3, and the first, second and third semiconductor layers 311, 312 and 313 (refer to FIG. 1). The mask 20 is used in a pattern forming process using a positive-type photoresist of which etching capacity is increased by light irradiation.

The mask 20 includes a base substrate 901 and a light shielding pattern 902 provided on the base substrate 901.

In an exemplary embodiment, the base substrate 901 may use a transparent glass or plastic substrate. However, the exemplary embodiment is not limited thereto, and the base substrate 901 may include another material having light transmittance and mechanical strength.

The light shielding pattern 902 may be provided by selectively coating a light shielding material on the base substrate 901.

The light shielding pattern 902 includes a light transmitting portion and a light shielding portion. In addition, the light shielding pattern 902 may further include a semi-transmissive portion.

The light shielding portion is an area in which light transmission is blocked, and corresponds to areas of the data line DL, the first, second and third source electrodes SE1, SE2 and SE3, and the first, second and third drain electrodes, DE1, DE2 and DE3 on the first substrate 301 (refer to FIG. 2).

In other words, the light shielding portion includes a data line portion 910 corresponding to the data line DL, a first source electrode portion 912 corresponding to the first source electrode SE1, a first drain electrode portion 913 corresponding to the first drain electrode DE1, a second source electrode portion 922 corresponding to the second source electrode SE2, a second drain electrode portion 923 corresponding to the second drain electrode DE2, a third source electrode portion 932 corresponding to the third source electrode SE3, and a third drain electrode portion 933 corresponding to the third drain electrode DE3.

In detail, the light shielding portion includes the first source electrode portion 912 extending from the data line portion 910, the first drain electrode portion 913 disposed to be spaced apart form the first source electrode portion 912, the second source electrode portion 922 connected to the first source electrode portion 912, the second drain electrode portion 923 disposed to be spaced apart from the second source electrode portion 922, the third source electrode portion 932 connected to the second drain electrode portion 923, and the third drain electrode portion 933 disposed to be spaced apart from the third source electrode portion 932 and including at least a portion parallel to the third source electrode portion 932.

The light shielding portion may be provided by coating a light shielding material on the base substrate 901.

The semi-transmissive portion is an area through which incident light is partially transmitted, and corresponds to respective channel regions of the first, second and third semiconductor layers 311, 312 and 313.

In detail, the semi-transmissive portion includes a first channel portion 911 corresponding to the channel region of the first semiconductor layer 311, a second channel portion 921 corresponding to the channel region of the second semiconductor layer 312, and a third channel portion 931 corresponding to the channel region of the third semiconductor layer 313.

In an exemplary embodiment, the semi-transmissive portion may have light transmittance, for example, in a range of about 25 percent (%) to about 75%, for example.

The semi-transmissive portion may be provided by coating a light shielding material on the base substrate 901, and the light transmittance of the semi-transmissive portion may be adjusted by adjusting the concentration of the light shielding material.

In addition, the semi-transmissive portion may have a structure in which a light transmitting area and a light shielding slit are alternately disposed, and the light transmittance of the light transmitting portion may be adjusted by adjusting an interval between the light transmitting area and the light shielding slit.

A portion of the mask 20 other than the light shielding portion and the semi-transmissive portion corresponds to the light transmitting portion.

Figure 9:
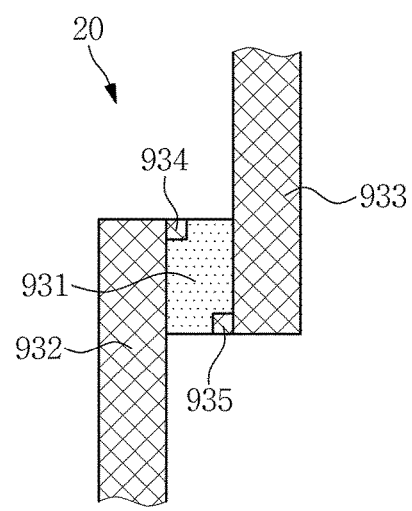
FIG. 9 is an enlarged view illustrating portion "A" of FIG. 7.

Referring to FIGS. 6(b) and 9, in order to prevent the generation of the concave portion 313a in the channel 700 of the third semiconductor layer 313 in the process of forming the data wiring unit, the mask 20 according to the exemplary embodiment includes a first protrusion 934 at an end portion of the third source electrode portion 932 and a second protrusion 935 at an end portion of the third drain electrode portion 933.

In an exemplary embodiment, the first protrusion 934 is a first auxiliary light shielding portion, and the second protrusion 935 is a second auxiliary light shielding portion. In addition, the end portion of the third source electrode portion 932 and the end portion of the third drain electrode portion 933 face one another while having the third channel portion 931 therebetween.

The first protrusion 934 and the second protrusion 935 prevent light irradiated to the light transmitting portion 905

(refer to FIG. 8) from affecting a photoresist on a channel region, to thereby prevent the over-exposure of the photoresist on the channel region more than necessary. As a result, a boundary of the channel 700 is distinctively defined and the generation of the concave portion 313a is prevented in the channel 700.

The auxiliary light shielding portion is absent at an end portion of the first source electrode portion 912, an end portion of the first drain electrode portion 913, an end portion of the second source electrode portion 922, and an end portion of the second drain electrode portion 923.

Hereinafter, another exemplary embodiment will be described with reference to FIG. 10.

Figure 10:
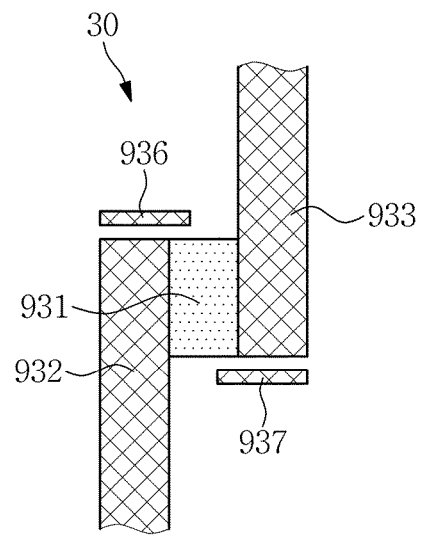
FIG. 10 is a partial plan view illustrating another exemplary embodiment of a mask.

FIG. 10 is a plan view of a portion of a mask 30 according to the exemplary embodiment illustrating an area for forming a third thin film transistor TFT3. In other words, the view illustrated in FIG. 10 corresponds to area "A" of FIG. 7. A description on components that is described in the foregoing will be omitted herein for conciseness.

The mask 30 according to the exemplary embodiment includes a third channel portion 931 corresponding to the channel 700 of the third semiconductor layer 313, a third source electrode portion 932 corresponding to the third source electrode SE3, and a third drain electrode portion 933 corresponding to the third drain electrode DE3, and a first auxiliary light shielding portion 936 disposed to be spaced apart from the third source electrode portion 932 and a second auxiliary light shielding portion 937 disposed to be spaced apart from the third drain electrode portion 933. The first auxiliary light shielding portion 936 and the second auxiliary light shielding portion 937 are spaced apart from the third channel portion 931.

The first auxiliary light shielding portion 936 and the second auxiliary light shielding portion 937 on the mask 30 according to the exemplary embodiment each have a bar shape, for example.

In detail, the first auxiliary light shielding portion 936 is disposed on the light transmitting portion 905 (refer to FIG. 8) while being adjacent to an end portion of the third source electrode portion 932 and to an upper portion of the third channel portion 931. As used herein, the term "upper" refers to the upward direction in the drawings.

The first auxiliary light shielding portion 936 prevents the upper portion of the third channel portion 931 from being affected by light irradiated to the light transmitting portion 905 during a light exposure process. Accordingly, the over-etching of the third semiconductor layer 313 at an upper interface of the third channel portion 931 is prevented.

The second auxiliary light shielding portion 937 is disposed on the light transmitting portion 905 while being adjacent to an end portion of the third drain electrode portion 933 and a lower portion of the third channel portion 931. As used herein, the term "lower" refers to the downward direction in the drawings.

The second auxiliary light shielding portion 937 prevents the lower portion of the third channel portion 931 from being affected by light irradiated to the light transmitting portion 905 during a light exposure process. Accordingly, the over-etching of the third semiconductor layer 313 at a lower interface of the third channel portion 931 is prevented.

Hereinafter, another exemplary embodiment will be described with reference to FIG. 11.

Figure 11:
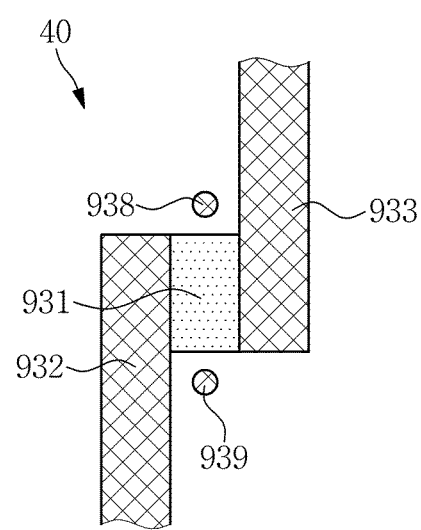
FIG. 11 is a partial plan view illustrating another exemplary embodiment of a mask.

FIG. 11 is a plan view of a portion of a mask 40 according to the exemplary embodiment illustrating an area for forming a third thin film transistor TFT3.

The mask 40 according to the exemplary embodiment is different from the mask 30 according to the exemplary embodiment in that a first auxiliary light shielding portion 938 and a second auxiliary light shielding portion 939 each have a circular shape, for example.

In detail, the mask 40 according to the exemplary embodiment includes the first auxiliary light shielding portion 938 disposed between a third source electrode portion 932 and a third drain electrode portion 933 while being spaced apart from the third source electrode portion 932, and the second auxiliary light shielding portion 939 disposed between the third source electrode portion 932 and the third drain electrode portion 933 while being spaced apart from the third drain electrode portion 933.

The first auxiliary light shielding portion 938 prevents an upper portion of a third channel portion 931 from being affected by light irradiated to a light transmitting portion 905 (refer to FIG. 8) during a light exposure process, and the second auxiliary light shielding portion 939 prevents a lower portion of the third channel portion 931 from being affected by light irradiated to the light transmitting portion 905 during the exposure process.

Hereinafter, another exemplary embodiment will be described with reference to FIG. 12.

Figure 12:
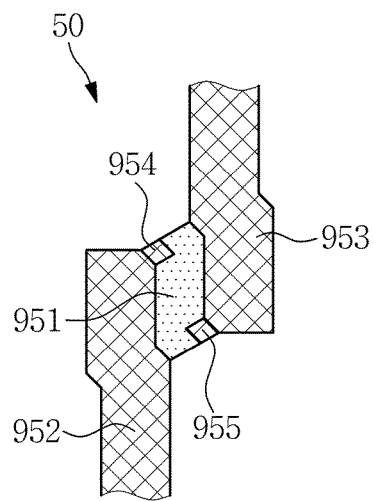
FIG. 12 is a partial plan view illustrating another exemplary embodiment of a mask.

FIG. 12 is a plan view illustrating a portion of a mask 50 according to the exemplary embodiment illustrating an area for forming a third thin film transistor TFT3.

The mask 50 according to the exemplary embodiment is different from the mask 20 according to the exemplary embodiment in that a third source electrode portion 952 corresponding to the third source electrode SE3 and a third drain electrode portion 953 corresponding to the third drain electrode DE3 each have a bent bar shape rather than a linear shape. A third channel portion 951 of the mask 50 according to the exemplary embodiment has an inverted-S shape, for example.

The mask 50 according to the exemplary embodiment includes a first protrusion 954 disposed at an end portion of the third source electrode portion 952, and a second protrusion 955 at an end portion of the third drain electrode portion 953. The first protrusion 954 and the second protrusion 955 protrude toward the third channel portion 951 so as to prevent light irradiated to the light transmitting portion 905 (refer to FIG. 8) from affecting the third channel portion 951 during a light exposure process.

Hereinafter, an exemplary embodiment will be described with reference to FIG. 13.

Figure 13:
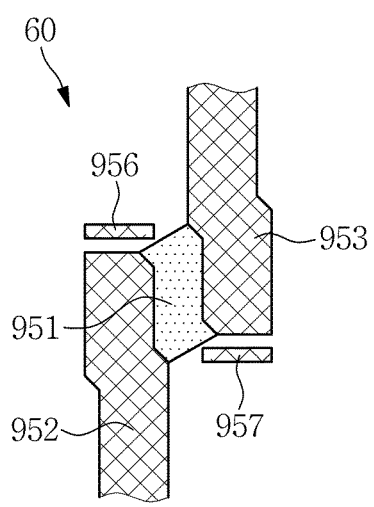
FIG. 13 is a partial plan view illustrating another exemplary embodiment of a mask.

FIG. 13 is a plan view illustrating a portion of a mask 60 according to the exemplary embodiment illustrating an area for forming a third thin film transistor TFT3.

The mask 60 according to the exemplary embodiment is different from the mask 30 according to the exemplary embodiment in that a third source electrode portion 952 corresponding to the third source electrode SE3 and a third drain electrode portion 953 corresponding to the third drain electrode DE3 each have a bent bar shape rather than a linear shape, for example.

The mask 60 according to the exemplary embodiment includes a first auxiliary light shielding portion 956 disposed to be spaced apart from the third source electrode portion 952, and a second auxiliary light shielding portion 957 disposed to be spaced apart from the third drain electrode portion 953. The first auxiliary light shielding portion 956 and the second auxiliary light shielding portion 957 are spaced apart from a third channel portion 951.

The first auxiliary light shielding portion 956 and the second auxiliary light shielding portion 957 on the mask 60 according to the exemplary embodiment each have a bar shape, for example.

Hereinafter, an exemplary embodiment will be described with reference to FIG. 14.

Figure 14:
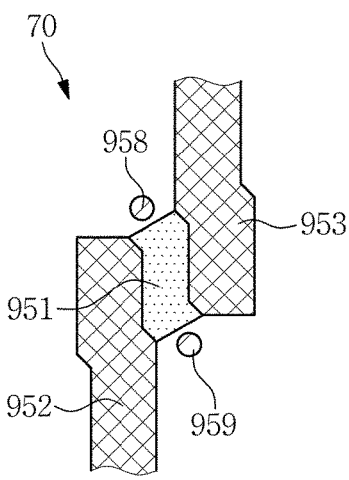
FIG. 14 is a partial plan view illustrating another exemplary embodiment of a mask.

FIG. 14 is a plan view illustrating a portion of a mask 70 according to the exemplary embodiment illustrating an area for forming a third thin film transistor TFT3.

The mask 70 according to the exemplary embodiment is different from the mask 40 according to the exemplary embodiment in that a third source electrode portion 952 corresponding to the third source electrode SE3 and a third drain electrode portion 953 corresponding to the third drain electrode DE3 each have a bent bar shape rather than a linear shape, for example.

In detail, the mask 70 according to the exemplary embodiment includes a first auxiliary light shielding portion 958 disposed to be spaced apart from the third source electrode portion 952, and a second auxiliary light shielding portion 959 disposed to be spaced apart from the third drain electrode portion 953.

The first auxiliary light shielding portion 958 and the second auxiliary light shielding portion 959 on the mask 70 according to the exemplary embodiment have a circular shape, for example.

Hereinafter, a method of manufacturing a display device will be described with reference to FIGS. 15A to 15K.

FIGS. 15A to 15K are views illustrating processes of a method of manufacturing a display device. In particular, a method of manufacturing the LCD device 10 (refer to FIG. 1) according to the exemplary embodiment will be described based on a cross-sectional view taken along section line III-III' of FIG. 1 for ease of description.

Figure 15A:
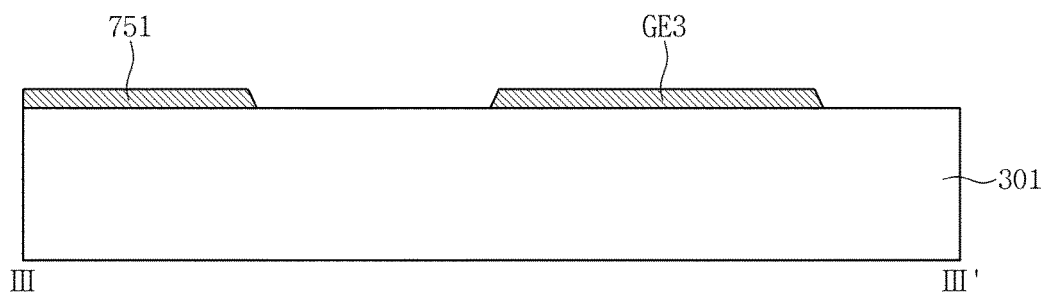
FIGS. 15A to 15K are views illustrating processes of a method of manufacturing a display device, respectively.

Referring to FIGS. 1 and 15A, the third gate electrode GE3 and the first storage line 751 are disposed on the first substrate 301 including a transparent material such as glass or plastic. Although not illustrated in FIG. 15A, the gate line GL, the first gate electrode GE1, the second gate electrode GE2, and the second storage line 752 are provided along therewith.

The gate line GL, the first, second and third gate electrodes GE1, GE2 and GE3, the first storage line 751, and the second storage line 752 are described in the foregoing, and thus, a detailed description thereof will be omitted herein for conciseness.

A first pattern mask (not illustrated) may be used to form the gate line GL, the first, second and third gate electrodes GE1, GE2 and GE3, the first storage line 751, and the second storage line 752.

Figure 15B:
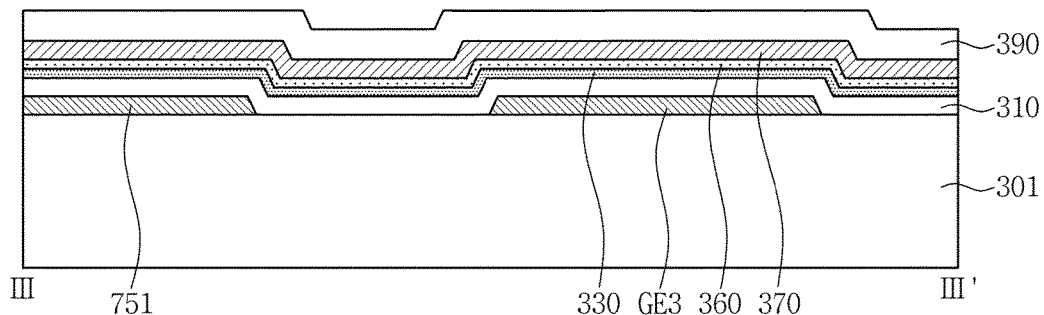

Referring to FIGS. 1 and 15B, the gate insulating layer 310 including SiNx or SiOx is disposed on the gate line GL, the first, second and third gate electrodes GE1, GE2 and GE3, the first storage line 751, the second storage line 752, and an exposed portion of the first substrate 301. The gate insulating layer 310 may have a multilayer structure including at least two insulating layers having different physical or chemical properties from one another.

In addition, a semiconductor material 330 is coated over an entire surface of the gate insulating layer 310, then the ohmic contact member 360 is coated thereon, and then a conductive material for forming the data wiring unit is coated thereon to thereby form a conductive layer 370.

In an exemplary embodiment, the semiconductor material 330 may be a silicon-based semiconductor material such as amorphous silicon or polycrystalline silicon. In the case that the semiconductor material 330 of FIG. 15B is amorphous silicon, laser is irradiated to the semiconductor material 330 to thereby crystallize amorphous silicon.

In an exemplary embodiment, the semiconductor material 330 may include an oxide semiconductor material. In an exemplary embodiment, the oxide semiconductor material may include at least one of zinc (Zn), gallium (Ga), indium (In), and tin (Sn), for example.

The ohmic contact member 360 forms an ohmic contact layer on the semiconductor material 330.

The conductive layer 370 for forming the data wiring unit may include a conductive material. In an exemplary embodiment, the conductive layer 370 for forming the data wiring unit may include at least one of molybdenum (Mo), chromium (Cr), titanium (Ti), tantalum (Ta), aluminum (Al), silver (Ag), and copper (Cu), for example.

Figure 15C:
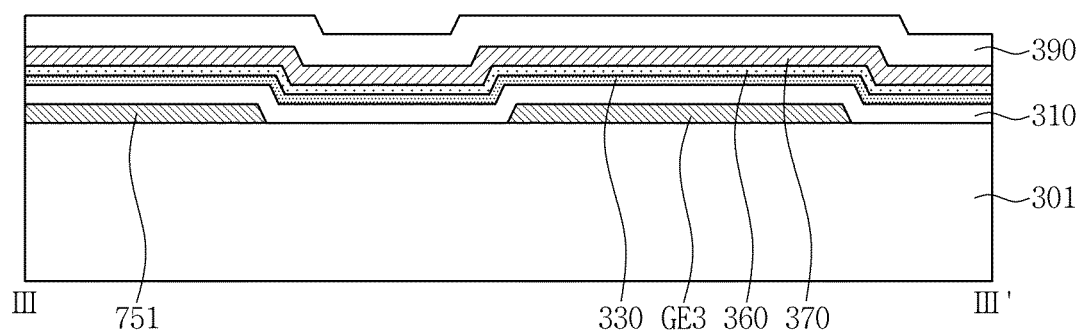

Referring to FIG. 15C, a photoresist 390 is coated on the conductive layer 370 for forming the data wiring unit, and the mask 20 according to the exemplary embodiment is disposed above the photoresist 390 while being spaced apart from the photoresist 390. The mask 20 according to the exemplary embodiment corresponds to a second pattern mask.

Light L is irradiated through the mask 20 to thereby perform selective light exposure on the photoresist 390.

The photoresist 390 may include a photoresist commonly used in forming a metal pattern, and more particularly, a positive-type photoresist of which etching capacity is increased by light irradiation.

The mask 20 includes the light transmitting portion 905, the light shielding portions, for example, the third source electrode portion 932 and the third drain electrode portion 933, and the semi-transmissive portion, for example, the third channel portion 931. Such a mask 20 is referred to as a half-tone mask.

The light shielding portion of the mask 20 corresponds to the data wiring unit, and the semi-transmissive portion corresponds to the channel 700 of the semiconductor layer.

Figure 15D:
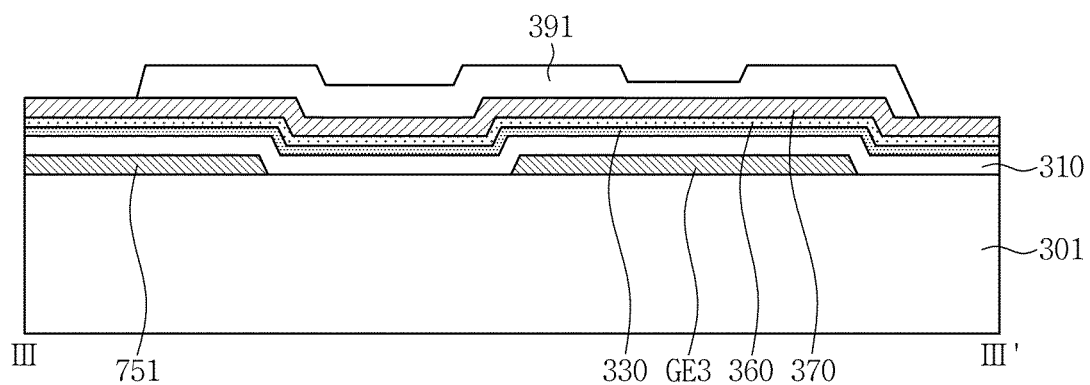

Referring to FIG. 15D, the selectively exposed photoresist 390 undergoes a primary patterning to thereby form a primary photoresist pattern 391.

Figure 15E:
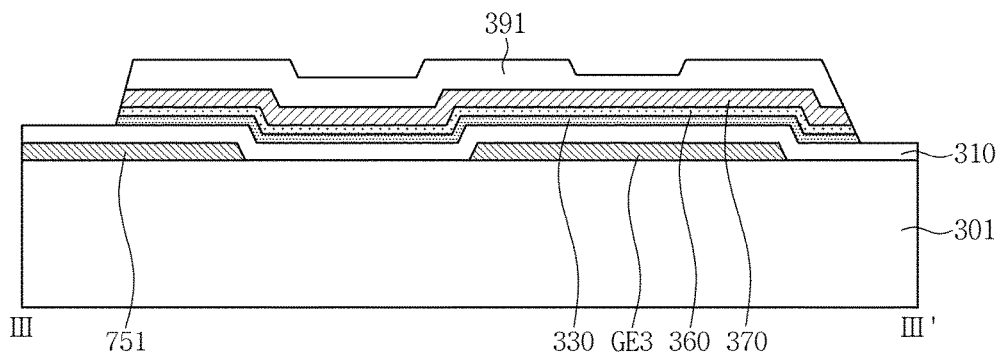

Referring to FIG. 15E, the semiconductor material 330, the ohmic contact member 360, and the conductive layer 370 disposed on an area other than the data wiring unit and on the region of the channel 700 of the semiconductor layer are removed by a primary etching using the primary photoresist pattern 391.

In an exemplary embodiment, the primary etching may be wet etching or dry etching, for example. The etching scheme may be conveniently selected by a person having ordinary skill in the art.

Figure 15F:
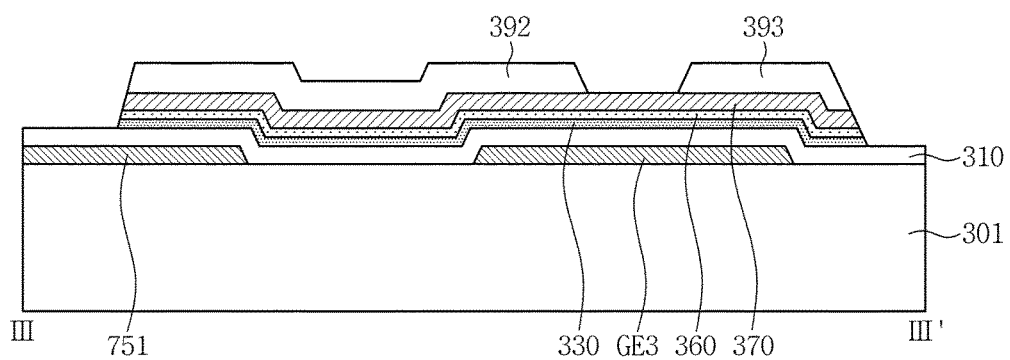

Referring to FIG. 15F, a portion of the primary photoresist pattern 391 is removed to thereby form secondary photoresist patterns 392 and 393. Accordingly, the photoresist on the channel 700 of the semiconductor layer is completely removed to thereby expose a portion of the conductive layer 370.

Figure 15G:
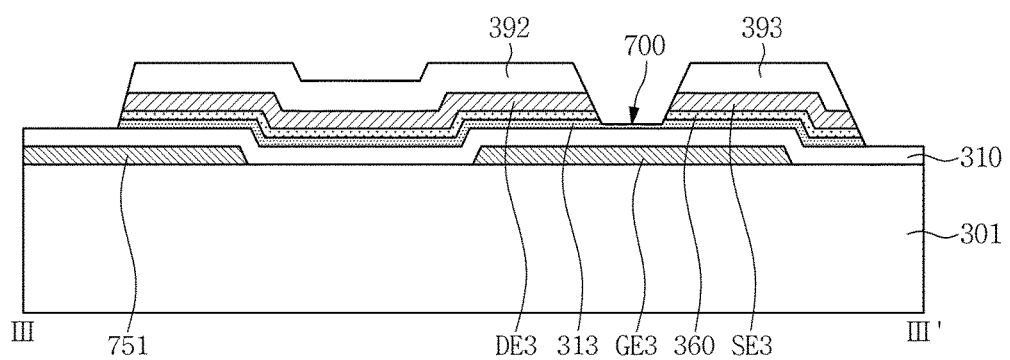

Referring to FIG. 15G, respective portions of the ohmic contact member 360 and the conductive layer 370 in the region of the channel 700 are removed by a secondary etching using the secondary photoresist patterns 392 and 393. In an exemplary embodiment, a portion of the semiconductor material 330 on the channel 700 may be removed together. Accordingly, the third source electrode SE3, the third drain electrode DE3, and the third semiconductor layer 313 are provided.

In an exemplary embodiment, the secondary etching may be wet etching or dry etching, for example. By adjusting etching selectivity, an exposed area that is not protected by the secondary photoresist patterns 392 and 393 is selectively removed.

Figure 15H:
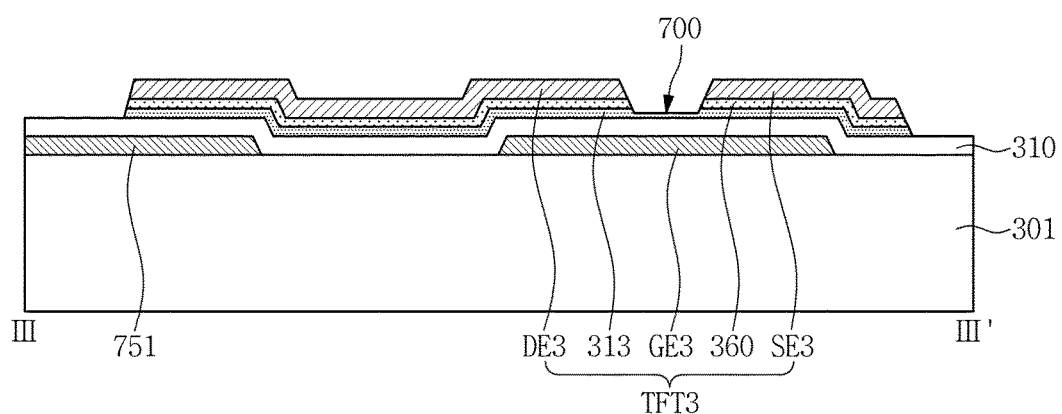

Referring to FIG. 15H, the secondary photoresist patterns 392 and 393 on the conductive layer 370 for forming the data wiring unit are removed to thereby form the third thin film transistor TFT3.

Although not illustrated, the data line DL, the first thin film transistor TFT1, and the second thin film transistor TFT2 are provided along therewith.

Figure 15I:
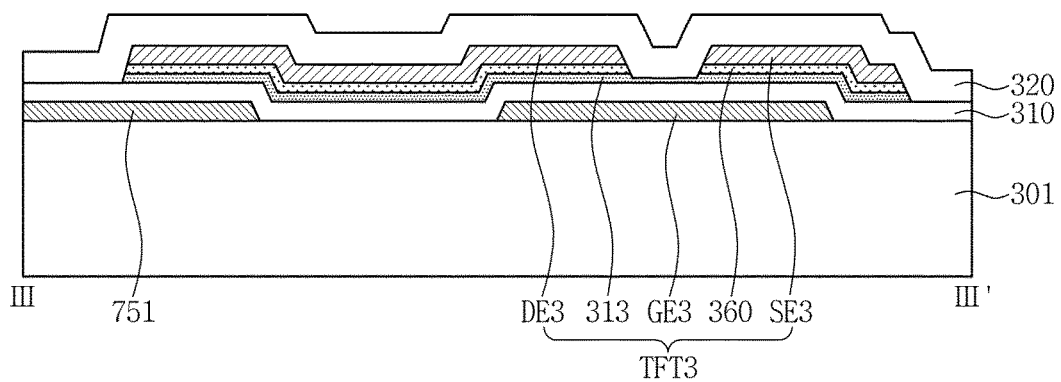

Referring to FIG. 15I, the passivation layer 320 is disposed over an entire surface of the first substrate 301 on which the third thin film transistor TFT3 is disposed.

In an exemplary embodiment, the passivation layer 320 may have a monolayer or multilayer structure including silicon oxide, silicon nitride, a photosensitive organic material, or a low dielectric constant insulating material, for example. The passivation layer 320 serves to protect the thin film transistor, and planarize an upper portion of the thin film transistor.

Figure 15J:
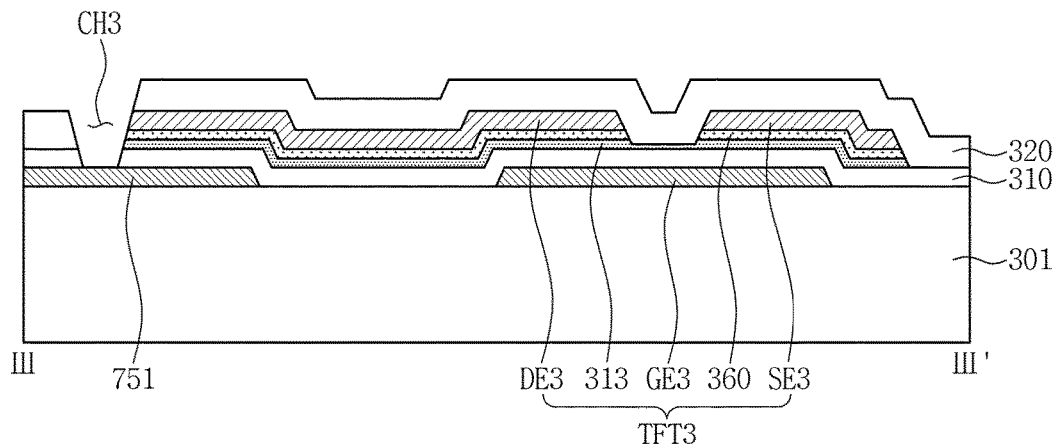

Referring to FIG. 15J, respective portions of the passivation layer 320 and the gate insulating layer 310 are removed to thereby define the third contact hole CH3 through which a portion of the first storage line 751 and a portion of the third drain electrode DE3 are exposed. Light exposure and etching processes using a third pattern mask are performed to form the third contact hole CH3.

Figure 15K:
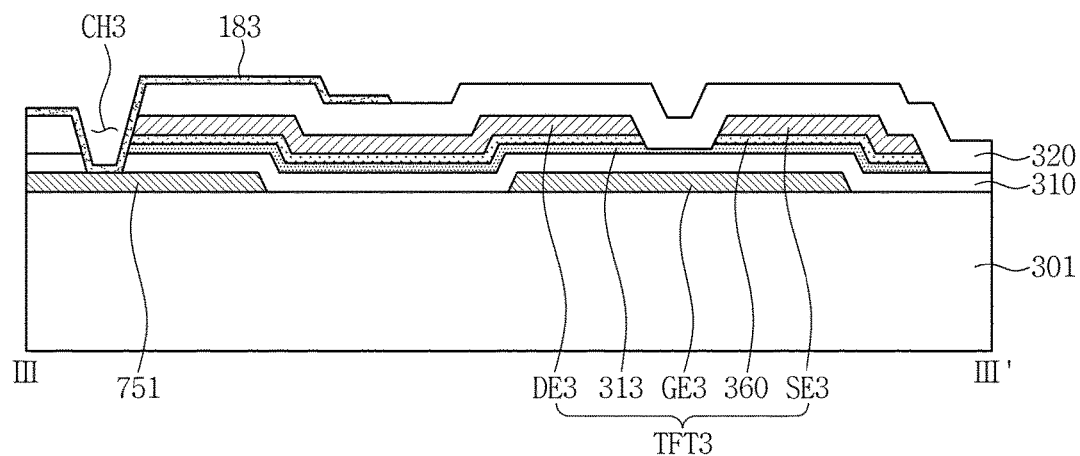

Referring to FIG. 15K, the third extension electrode 183 electrically connected to the first storage line 751 is disposed on the passivation layer 320 through the third contact hole CH3. In an exemplary embodiment, the third extension electrode 183 may include TCO such as ITO, IZO or AZO. Light exposure and etching processes using a fourth pattern mask is performed to form the third extension electrode 183.

The second substrate 302 is disposed on the first substrate 301 to oppose the first substrate 301, and the liquid crystal layer 333 is interposed between the first substrate 301 and the second substrate 302 to thereby form the LCD device 10. The black matrix 376, the color filter 354, the overcoat layer 722, and the common electrode 210 are disposed on the second substrate 302.

Figure 16:
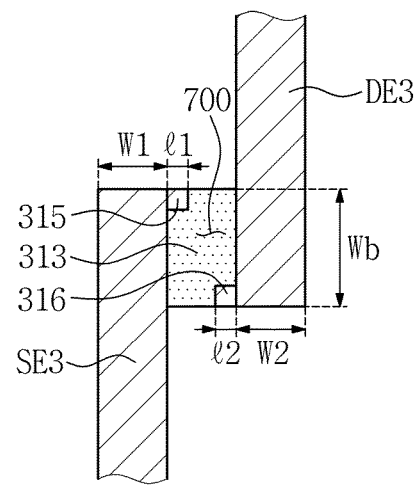
FIGS. 16 and 17 are partial plan views illustrating the exemplary embodiment of third TFTs in the display device.
Figure 17:
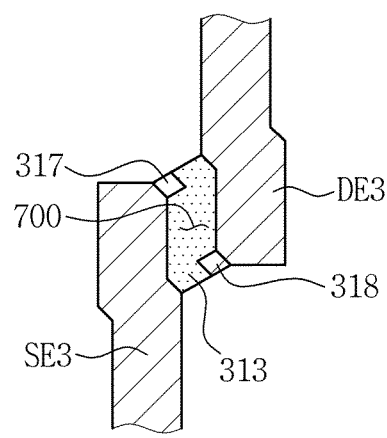

FIGS. 16 and 17 are partial plan views illustrating third thin film transistors TFT3 in the LCD device 10 according to the exemplary embodiment manufactured in the above-described method.

Referring to FIG. 16, a first protrusion 315 protruding toward the third drain electrode DE3 is disposed at an end portion of a third source electrode SE3, and a second protrusion 316 protruding toward the third source electrode SE3 is disposed at an end portion of a third drain electrode DE3.

In an exemplary embodiment, the third source electrode SE3 and the third drain electrode DE3 may have a width W1 and a width W2, respectively, in a range of about 3 micrometers (μm) to about 5 μm, for example. In an exemplary embodiment, the first protrusion 315 and the second protrusion 316 may have a protruding length l1 and a protruding length l2, respectively, in a range of about 0.1 μm to about 0.5 μm, for example.

The third source electrode SE3 and the third drain electrode DE3 are disposed on the third semiconductor layer 313 in parallel to one another, and each have a bar shape, for example.

Referring to FIG. 17, the third source electrode SE3 and the third drain electrode DE3 are disposed on the third semiconductor layer 313 in parallel to one another, and each have a bent bar shape, for example. The first protrusion 317 protruding toward the third drain electrode DE3 is disposed at an end portion of a third source electrode SE3, and a second protrusion 318 protruding toward the third source electrode SE3 is disposed at an end portion of a third drain electrode DE3.

In addition, the protrusion is absent at an end portion of the first source electrode SE1, an end portion of the first drain electrode DE1, an end portion of the second source electrode SE2, and an end portion of the second drain electrode DE2.

As set forth above, according to one or more exemplary embodiments, the display device having high quality and high-resolution may be provided using the mask.

From the foregoing, it will be appreciated that various embodiments in accordance with the disclosure have been described herein for purposes of illustration, and that various modifications may be made without departing from the scope and spirit of the teachings. Accordingly, the various embodiments disclosed herein are not intended to be limiting of the true scope and spirit of the teachings. Various features of the above described and other embodiments can be mixed and matched in any manner, to produce further embodiments consistent with the invention.

What is claimed is:

1. A method of fabricating a display device, the method comprising:
   forming a first gate electrode, a second gate electrode and a third gate electrode on a first substrate;
   forming a gate insulating layer on the first gate electrode, the second gate electrode and the third gate electrode;
   coating a semiconductor material on the gate insulating layer;
   coating a conductive material on the semiconductor material to form a conductive layer;
   coating a photoresist on the conductive layer;
   disposing a mask over the photoresist;
   irradiating light to the mask to perform selective light exposure on the photoresist;
   patterning the photoresist; and
   patterning the semiconductor material and the conductive layer using the patterned photoresist,
   wherein the mask comprises:
   a base substrate; and
   a light shielding pattern comprising a light transmitting portion and a light shielding portion on the base substrate, and
   the light shielding portion comprises:
   a first source electrode portion;
   a first drain electrode portion spaced apart from the first source electrode portion;
   a second source electrode portion connected to the first source electrode portion;
   a second drain electrode portion spaced apart from the second source electrode portion;
   a third source electrode portion connected to the second drain electrode portion;
   a third drain electrode portion spaced apart from the third source electrode portion, the third drain electrode portion including at least a portion parallel to the third source electrode portion;
   a first auxiliary light shielding portion at an end portion of the third source electrode portion; and
   a second auxiliary light shielding portion at an end portion of the third drain electrode portion.

2. The method of claim 1, wherein the first auxiliary light shielding portion contacts the third source electrode portion and protrudes toward the third drain electrode portion.

3. The method of claim 1, wherein the first auxiliary light shielding portion is between the third source electrode portion and the third drain electrode portion and is spaced apart from the third source electrode portion.

4. The method of claim 1, wherein the first auxiliary light shielding portion has a bar shape.

5. The method of claim 1, wherein the first auxiliary light shielding portion has one of a circular shape and a polygonal shape.

6. The method of claim 1, wherein the second auxiliary light shielding portion contacts the third drain electrode portion and protrudes toward the third source electrode portion.

7. The method of claim 1, wherein the second auxiliary light shielding portion is between the third source electrode portion and the third drain electrode portion and is spaced apart from the third drain electrode portion.

8. The method of claim 1, wherein the second auxiliary light shielding portion has a bar shape.

9. The method of claim 1, wherein the second auxiliary light shielding portion has one of a circular shape and a polygonal shape.

10. The method of claim 1, wherein the patterning the semiconductor material and the conductive layer comprises:
    forming a third semiconductor layer including at least a portion overlapping the third gate electrode, a third source electrode including at least a portion overlapping the third semiconductor layer, and a third drain electrode spaced apart from the third source electrode and including at least a portion overlapping the third semiconductor layer, and
    the mask further comprises a channel portion between the third source electrode portion and the third drain electrode portion, the channel portion for forming a channel of the third semiconductor layer.

11. The method of claim 10, wherein the channel portion is a semi-transmissive portion.

12. The method of claim 10, wherein the third source electrode portion and the third drain electrode portion are disposed in parallel to one another at both sides of the channel portion, respectively, and each of the third source electrode portion and the third drain electrode portion has a bar shape.

13. The method of claim 10, wherein the third source electrode portion and the third drain electrode portion are disposed in parallel to one another at both sides of the channel portion, respectively, and each of the third source electrode portion and the third drain electrode portion has a bent bar shape.

* * * * *